United States Patent [19]
Griffin

[11] Patent Number: 4,866,663
[45] Date of Patent: Sep. 12, 1989

[54] SIMULATION SYSTEM
[75] Inventor: Daniel W. Griffin, Hollis, N.H.
[73] Assignee: Sanders Associates, Inc., Nashua, N.H.
[21] Appl. No.: 14,338
[22] Filed: Feb. 13, 1987
[51] Int. Cl.$^4$ .................... G06F 15/20; G06F 9/44
[52] U.S. Cl. .................... 364/900; 364/300; 364/578; 364/916.3; 364/933.8; 364/944.6; 364/948.2
[58] Field of Search .............. 364/200, 900, 578, 300
[56] References Cited

U.S. PATENT DOCUMENTS

| | | | |
|---|---|---|---|
| 4,075,689 | 2/1978 | Berkling | 364/200 |
| 4,084,235 | 4/1978 | Hirtle et al. | 364/200 |
| 4,342,093 | 7/1982 | Miyoshi | 364/578 |
| 4,386,403 | 5/1984 | Hsieh et al. | 364/300 |
| 4,405,980 | 9/1983 | Hess | 364/200 |
| 4,435,777 | 3/1984 | McCaskill et al. | 364/900 |
| 4,455,619 | 6/1984 | Masui et al. | 364/900 |
| 4,484,266 | 11/1984 | Becker et al. | 364/200 |
| 4,494,191 | 1/1985 | Itoh | 364/200 |
| 4,513,374 | 4/1985 | Hooks, Jr. | 364/200 |
| 4,527,249 | 7/1985 | Van Brunt | 364/578 |
| 4,533,997 | 8/1985 | Furgerson | 364/200 |
| 4,541,056 | 9/1985 | Matthews | 364/300 |
| 4,558,413 | 12/1985 | Schmidt et al. | 364/300 |
| 4,566,078 | 1/1986 | Crabtree | 364/900 |
| 4,583,169 | 4/1986 | Cooledge | 364/300 |
| 4,587,625 | 5/1986 | Marino, Jr. et al. | 364/578 |
| 4,590,551 | 5/1986 | Mathews | 364/200 |
| 4,677,587 | 6/1987 | Zemany, Jr. | 364/900 |
| 4,694,411 | 9/1987 | Burrows | 364/578 |
| 4,725,970 | 2/1988 | Burrows et al. | 364/578 |
| 4,725,971 | 2/1988 | Doshi et al. | 364/578 |

FOREIGN PATENT DOCUMENTS 58-146947  9/1983  Japan .................... 364/578

OTHER PUBLICATIONS

"Type SN74LS362 (TIM9904) Four-Phase Clock Generator/Driver", *The TTL Data Book for Design Engineers*, 2nd ed. (Texas Instruments, 1976), pp. 7-460 through 7-466.
"Type SN74LS362 (TIM9904) Four-Phase Clock Generator/Driver", *the Bipolar Microcomputer Components Data Book for Design Engineers*, 2nd ed. (Texas Instruments, 1979), pp. 6-27 through 6-33.
"Am2925 Clock Generator and Microcycle Length Controller", *Advanced Micro Devices Bipolar Microprocessor Logic and Interface Data Book* (Advanced Micro Devices, Sunnyvale, 1985), pp. 5-220 through 5-235.
"AM2925 Clock Generator and Microcycle Length Controller", *Advanced Micro Devices Bipolar Microprocessor Logic and Interface Data Book* (Advanced Micro Devices, Sunnyvale, 1983), pp. 5-238 through 5-251.
"Am2925 System Clock Generator and Driver: Advanced Information", *Advanced Micro Devices the AM2900 Family Data Book with Related Support Circuits* (Advanced Micro Devices, Sunnyvale, 1978), pp. 2-183.

*Primary Examiner*—Felix D. Gruber
*Attorney, Agent, or Firm*—Stanton D. Weinstein; Richard A. Jordan

[57] ABSTRACT

An interactive simulation system in which a complex system is simulated by means of a plurality of function modules, each defining a predetermined mathematical operation, are enabled to be processed by an executive program in an order defined by an operator in, for example, a script. Each function module has one or more input variables and one or more output variables, each having a set of flags indicating whether they have been provided during a simulation run. During a simulation, the executive program sequences through the script to process the function modules, if neessary more than once. At each function module, the executive determines whether the function module can be considered based on the flags, and if so, whether it needs to process the function module. Each function module also has a set of flags indicating whether it has been considered, and, if it has been, the executive program skips the function module during subsequent sequences through the script during a simulation run. The output of each function module can be displayed for an operator in a separate window on a video display terminal.

5 Claims, 3 Drawing Sheets

SIMULATION SYSTEM

BACKGROUND OF THE INVENTION

1. Field of the Invention

The invention relates generally to the field of digital data processing systems, and more specifically to systems for simulating the operation of analog or digital systems particularly by constructing and solving mathematical models describing the operations of such systems.

2. Description of the Prior Art

For a number of years, computerized simulation systems have been used to simulate the functioning of digital and analog systems, and specifically to enable processing of mathematical models of such systems by digital computers. After a first design pass, a designer or engineer generally constructs a simulation program which embodies the features of the design, and runs the program on a digital computer to simulate the operation of devices constructed in accordance with the design. After obtaining the results of the simulation, the designer may then perform additional design work and simulate the revised design. The designer may wait until he is satisfied with the result of the computer simulation before constructing a physical prototype of the system to verify the design, thereby saving time and expense.

In the past, simulation systems often required the system designer, who is usually an engineer or scientist, and not a computer programmer, to develop a custom program to use in this simulation. This generally either required the product designer himself to know a considerable amount of programming, or it required the product designer to work closely with a programmer to generate the simulation program. This essentially required the designer to know not only his own design specialty, but also computer programming to enable him to either generate the simulation program directly, or to be able to communicate with the programmer.

To reduce the amount of computer programming knowledge required by a system designer or engineer, simulation systems have been developed which include a library of preprogrammed function modules which are maintained by an executive program running in the computer. The function modules can be called up as they are identified by the designer in a script or other identification mechanism. Analog systems can be modelled mathematically by means of, for example, a number of differential equations which can be solved by means of differentiators, integrators, signal generators, adders and multipliers, various transforms and the like, and a simulation system therefor would include separate function modules for each of these functions. All of the function modules are separately available to the system designer. When he is preparing a simulation, all the designer need do is identify the functions to the executive program by means of, for example, a script indicating the order in which they are to be processed and the relationships among the various inputs to and outputs from each of the function modules to simulate the system. The executive program effectively links the selected function modules together, particularly in relation to the inputs to and outputs from each of the separate modules, and the result is a simulation program which will simulate the physical analog system in response to selected initial conditions and parameters provided by a designer.

Digital systems are simulated in a similar way as the aforementioned analog systems. Digital circuit elements, such as logic gates, flip-flops, delay lines and the like may be expressed by means of function modules which are maintained by the executive program and can be separately identified by the system designer. The executive program can then link the function modules representing the circuit elements in the same order as the designer has interconnected them in the logic design being simulated. The result is a program which simulates the operation of the logic circuit in response to selected input signals, initial conditions, and any circuit parameters which may have been selected by the designer.

In both analog and digital simulation systems, since the routines have been previously written and the system designer or engineer need only identify the interconnections or links between function modules, the designer need have little or no knowledge of computer programming to effectively simulate the system. The designer may require functions which may not be provided by the function modules maintained by the executive program, and thus may need to program those modules, but normally that is kept to a minimum. Virtually all of the programming is provided by the previously defined routines maintained by the executive program.

SUMMARY OF THE INVENTION

The invention provides a new and improved simulation system for simulating analog or digital systems.

In brief summary, the new simulation system includes an executive program which processes a sequence of function modules selected from a library of function modules identified by a script. Each function module includes a set of input variables and a set of output variables. The function module receives input values which comprise its input variables and produces therefrom a set of output values which comprise its output variables. A set of flags is associated with each input variable and output variable to indicate the status of the variable. The executive program sequences through the script and, depending on the condition of the flags associated with the input variables (1) processes the function module to update the output variables and the flags associated therewith, (2) determines that the flags associated with the output variables may be updated to a selected condition without processing the function module, or (3) sequences to the next function module without altering the condition of the flags associated with the output variables. If the executive program does either of the first two in connection with a function module and its output variables, it also conditions flags associated with the function module to indicate that it has finished with the function module for the simulation. The executive program may sequence through the script several times if necessary to so condition the flags associated with the function module and during subsequent sequences through the script, the executive program skips those function modules. The output values of the output variables from each function module can be depicted graphically for the operator on a video display terminal, and, when the output values are changed as a result of new input values, the display terminal updates the depiction on the terminal.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
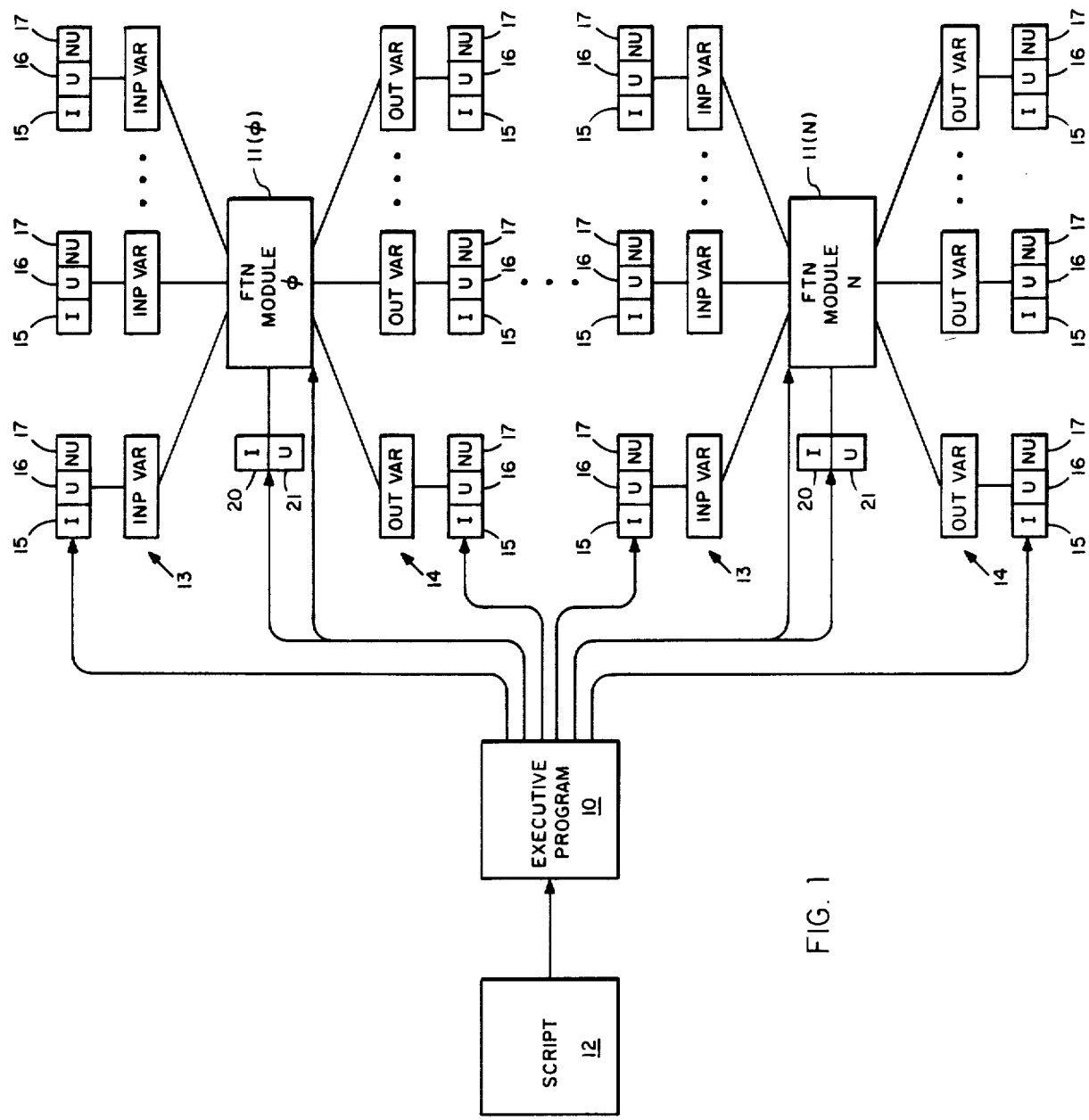
FIG. 1 is a functional block diagram depicting various data structures which are useful in understanding a simulation system constructed in accordance with the invention.

With reference to FIG. 1, a simulation system constructed in accordance with the invention includes an executive program 10 which controls a series of function modules 11(0) through 11(N) (generally identified by reference numeral 11) in accordance with a script 12 prepared by an operator at, for example, a video display terminal of a computer processing the simulation system. The function modules 11 identified in the script are selected from a library (not shown) of function modules maintained by the executive program in the computer system processing the simulation system. The script identifies the function modules to be processed and defines the order of processing and the relationship among them, specifically among their inputs and outputs during the processing.

Each function module represents a particular mathematical and/or logical operation which can be performed by the simulation system on a set of input variables generally identified by reference numeral 13 to provide a set of output variables generally identified by reference numeral 14. The particular number and identification of input and output variables 13 and 14 depend upon the nature of the function modules 11, specifically the mathematical and/or logical operation represented thereby.

The script 12 provided by the operator represents the mathematical and/or logical steps in a sequence that is required to simulate a system. In response to the steps depicted in the script, the executive program identifies from its library of function modules the specific function modules 11 to be used in the simulation and the relation of output variables of each function module 11 to input variables of other function modules. From this information, the executive program processes the script as described below in connection with FIG. 2. It will be appreciated that a script may identify a particular function module from the library more than once, if necessary in the simulation. In particular, the executive program may provide any number of copies of a function module from its library as required to process simulation required by the script.

During a simulation, the output variables 14 of each function module 11 may represent the input variables 13 of one or more other function modules 11. In addition, one or more output variables may also represent the simulation output desired by the operator. In one specific embodiment, the output variables from each function module 11 are typically graphically displayed for the operator in separate windows on the video display terminal, so that the operator can see the results of each simulation. An input variable 12 provided to a function module 11 may represent an output variable from another function module, or it may represent an input parameter or value provided by the operator.

Associated with each input variable 13 and output variable 14 associated with a function module 11 is a set of three flags, namely a VAR IDLE flag generally indicated by reference numeral 15, a VAR UPDATE flag generally indicated by reference numeral 16, and a VAR NO UPDATE flag generally indicated by reference numeral 17. If an output variable of one function module 11 is also a input variable of another function module, only one set of flags 15 through 17 is provided for that variable.

In addition, associated with each function module 11 is a set of two flags, namely a MOD IDLE flag 20 and a MOD UPDATE flag 21.

As described below in connection with FIGS. 2A and 2B, the executive program 10 uses flags 15 through 17, 20 and 21 to coordinate processing of the various functional modules 11 identified in the script 12 to minimize processing time and to determine when the processing has been completed. The condition of an VAR IDLE flag 15 generally indicates whether, during a simulation run (that is, during processing of the script based on a set of input values provided by the operator), a new value has been provided for the variable, whether by the operator or by a function module 11. The output variable 14 may have the same value as previously or its value may have changed.

The VAR UPDATE flag 16, when set, generally indicates that a new value has been provided to the output variable 14 as a result of processing of the function module 11. It will be appreciated that the new value provided to the output variable 14 by the function module 11 may be the same as before the processing of the function module 11, but the VAR UPDATE flag 16 will still be set. If a new value has been provided to the output variable by the function module 11, then, as described below, the executive program 10 processes the function modules 11 for which the output variable 14 also serves as an input variable 13. In addition, the set VAR UPDATE flag 16 indicates to the window manager of the video display window associated with the function module that the video display window associated with the function module requires updating.

The set VAR NO UPDATE flag 17 generally indicates that no new value has been provided to the output variable 14. The only circumstance under which the VAR NO UPDATE flag 17 for an output variable is set is when all of the VAR NO UPDATE flags 17 associated with the input variables 13 of a function module 11 are in a set condition. When this occurs, the executive program does not initiate processing of the function module 11, but instead sets the VAR NO UPDATE flags 17 associated with all of the output variables 14 of the function module 11. This can occur only when one or more input values provided by the operator which are used by the function module, either directly or indirectly through other function modules, have not been changed.

The condition of the MOD IDLE and MOD UPDATE flags 20 and 21 indicate whether the executive program has completed processing of the script 12 in response to a new input value or set of values from the operator. Since a function module 11 may have input variables 13 which correspond to output variables 14 of function modules 11 which are identified later in the script 12, the executive program 10 may be required to step through the sequence of function modules 11 multiple times to process the script 12. The executive program uses the MOD IDLE and MOD UPDATE flags 20 and 21 to determine if (1) it has already processed a particular function module 11 or (2) if it need not process the function module 11 because the VAR NO UPDATE flags 17 associated with all of its input variables 13 are set. If either of these two conditions have been met for a function module 11, the executive program 10 has considered the function module 11 and need not consider it again.

Figure 2A:
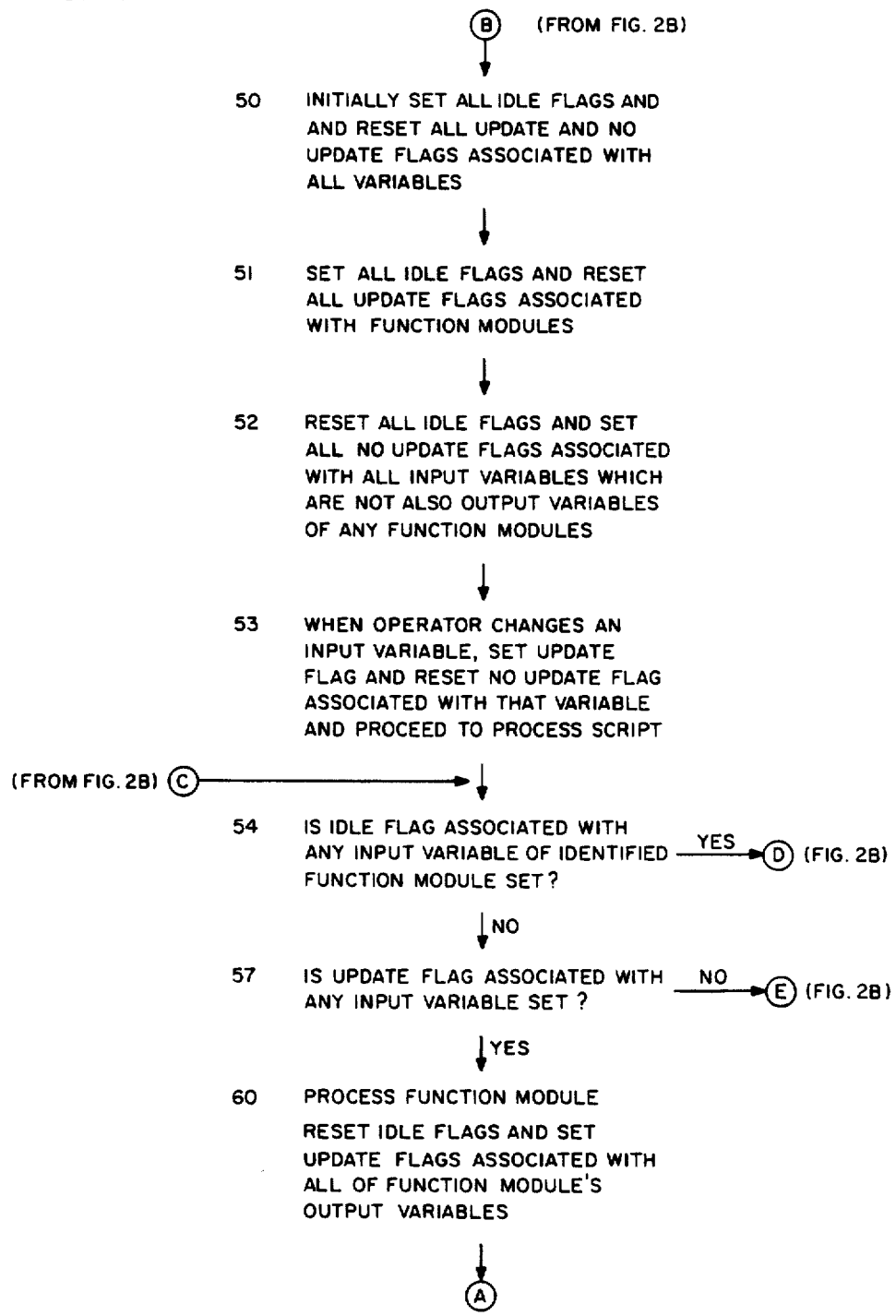
FIGS. 2A and 2B are flow diagrams detailing the operation of the new simulation system.
Figure 2B:
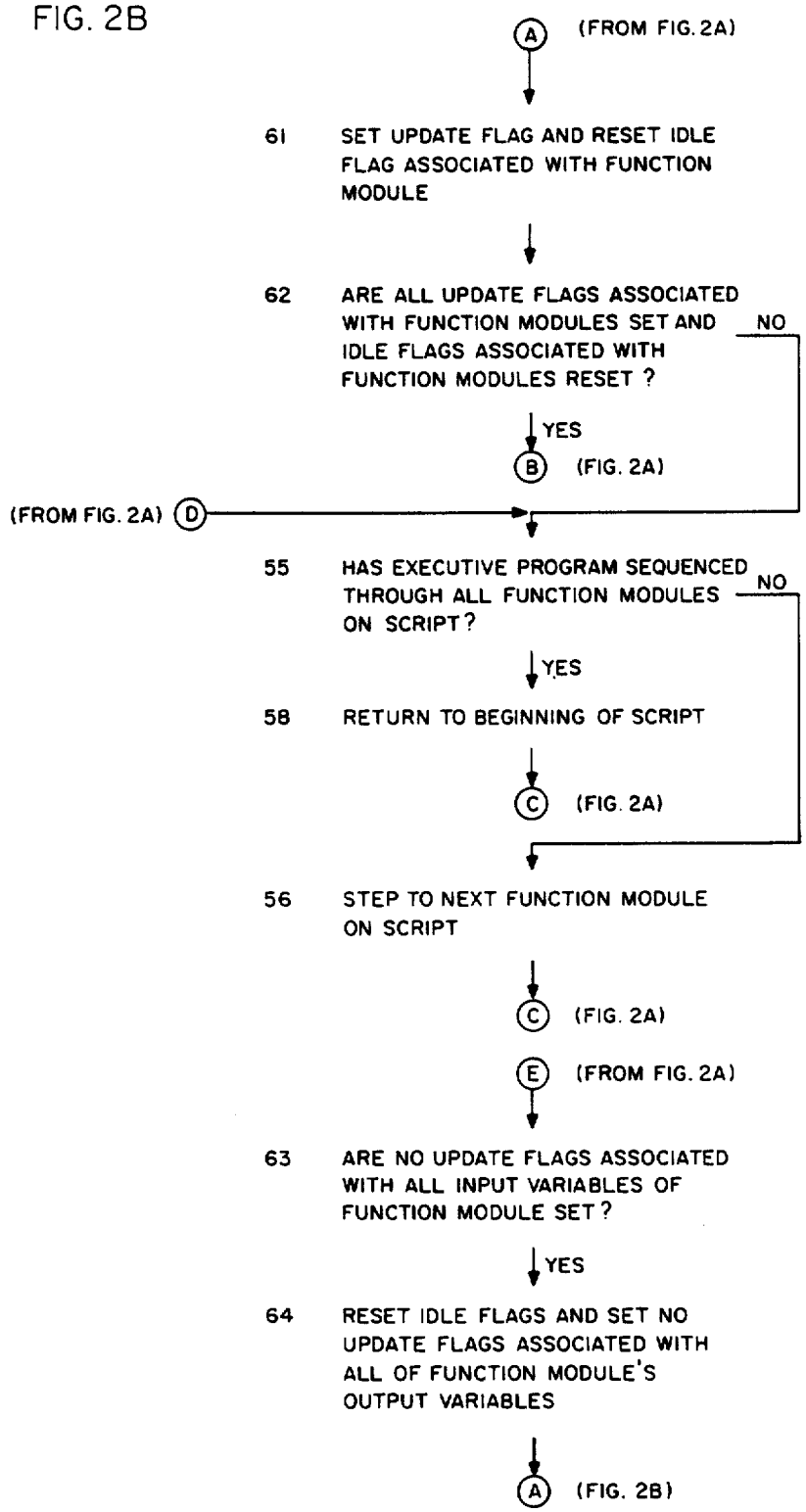

The operations performed by the executive program in controlling a simulation specified in a script 12 are depicted in FIGS. 2A and 2B. With reference to FIG. 2A, as specified in steps 50, 51 and 52, the executive program 10 initializes the VAR IDLE flags 15 of the input and output variables 13 and 14 of the function modules 11 identified in the script 12 to a set condition and the VAR UPDATE and VAR NO UPDATE flags 16 and 17 of the function modules 11 to a reset condition (step 50). The executive program 10 also initializes the MOD IDLE flags 20 of the function modules 11 to a set condition and their MOD UPDATE flags 21 to a reset condition (step 51).

Finally, the executive program 10 determines which of the input variables 13 of function modules 11 identified in the script 12 are not also output variables of other function modules 11 so as to identify which input variables are to be provided by the operator. The executive program resets all of the VAR IDLE flags 15 associated with these input variables 13 and initializes their NO UPDATE flags 17 to a set condition (step 52).

The operations depicted in steps 50 through 52 may be performed by the executive program at the end of a previous simulation run, and define the initial conditions of the flags when a simulation run is begun. The executive program then waits until the operator provides a new value for one or more input variables (step 53) to initiate a new simulation run.

When, in step 53, the operator provides a new value for one or more input variable 13 which is to be provided by the operator, that is, for an input variable 13 which is not also the output variable 14 of another function module 11, the executive program sets the UPDATE flag associated with that input variable 13, resets the NO UPDATE flag 17 and proceeds to consider the function modules identified in the script (step 53). At this point, the executive program 10 begins with the first function module 11 in the script 12.

The executive program first determines whether the VAR IDLE flag 15 associated with any of the input variables 13 of the first function module 11 in the script are in a set condition (step 54). If a VAR IDLE flag is set, the function module 11 cannot be processed, and the executive program 10 sequences to step 55 (FIG. 2B) to determine whether all of the function modules 11 in the script have been considered. If all of the function modules on the script 12 have been considered, the executive program returns to the first function module 11 identified in the script 12 (step 58), and sequences to step 54 (FIG. 2A).

If in step 55, all of the function modules on the script 12 have not been considered, the executive program sequences to step 56, in which it steps to the next function module 11 identified on script 12, and returns to step 54 to determine the condition of the VAR IDLE flags 15 associated with the input variables for that function module. The executive program repeats the sequence of operations set forth in steps 54, 55, and 56 until it reaches a function module 11 whose input variable's VAR IDLE flags 15 are not all set.

When, in step 54, the executive program determines that no VAR IDLE flag 15 associated with an input variable 13 of a function module 11 is set, it sequences to step 57. In step 57, the executive program determines whether the VAR UPDATE flag 16 associated with an input variable 13 of the function module 11 is set. If so, it processes the function module (step 60), enabling output values to be stored in the output variables 14. The executive program 10 then resets the VAR IDLE flags 15 and sets the VAR UPDATE flags 16 associated with all of the function module's output variables 14. Since the function module 11 has been processed, the executive program 10 sets the MOD UPDATE flag 21 and resets the MOD IDLE flag 20 associated with the function module 11 (step 61).

Following step 61, the executive program determines whether the MOD UPDATE flags 21 of all of the function modules 11 identified in the script are set and their MOD IDLE flags 20 reset (step 62), which is the condition when all of the function modules in the script have been considered, and that the simulation is in condition for termination. In that condition, the executive program returns to step 50 (FIG. 2A).

If, in step 62, the MOD UPDATE flags 21 of all of the function modules 11 identified in the script are not set, the executive program sequences to step 55 to determine whether it has sequenced through all of the function modules on the script. If it has, the executive program 10 sequences to step 56 for the next function module on the script 12, and from there returns to step 54.

Returning to step 62, if the condition is met, all of the function modules 11 have been considered and the executive program returns to step 50 (FIG. 2A). At that point, the executive program may initialize the flags as described in steps 50 through 52.

Returning to step 57 (FIG. 2A), if no VAR UPDATE flag 15 associated with the function module 11 is in the set condition, the executive program 10 sequences to step 63 to test whether the VAR NO UPDATE flags associated with all of the input variable 13 of the function module 11 are in the set condition. If the VAR NO UPDATE flags 17 are not in the set condition after the tests in steps 54 and 57 (FIG. 2A), an error condition exists (not shown). If the VAR NO UPDATE flags 17 of all of the input variables 13 are in the set condition, the executive program 10 sequences to step 64 in which it resets the VAR IDLE flags 15 and sets the VAR UPDATE flags 16 associated with the output variables 14 of the function module 11. The executive program does not, however, enable processing of the function module 11.

Following step 64, the executive program sequences to step 61 to set the MOD UPDATE flag 21 and reset the MOD IDLE flag 15 to indicate that the function module 11 identified on the script 12 has been considered during the simulation. In this case the function module has not been processed, but because of the condition of the various flags 15 through 17 associated with the function module's input variables, the executive program determines that the function module 11 need not be executed, thereby saving time in processing of the simulation. After step 61, the executive program, in step 62, determines, based on the conditions of the various flags as described above, whether all of the function modules have been considered. If so, the simulation run is terminated. If not, the executive program 10 sequences to step 54 for the next function module 11 on the script or returns to the first function module 11 on the script. It will be appreciated that the executive program may sequence through the script a number of times if necessary to provide input values for the function modules, which are provided when the VAR IDLE flag 15 for the associated input variables have been reset and either the VAR UPDATE flag 16 or the VAR NO UPDATE flag 17 have been set.

It will be further appreciated that during a simulation run, the executive program 10 considers the function modules 11 in one of two ways, depending on the conditions of the various flags 15 through 17. The executive program does not consider a function module 11 if the VAR IDLE flag 15 associated with any of the input variables 13 is in the set condition; in that case the input variable values for the function module 11 have not all been specified for the simulation run. This is depicted in the sequence identified by steps 54, 55 and 56 or 58.

If the VAR IDLE flags 15 associated with the input variables of a function module 11 are not in the set condition, the function module may be considered. The executive program then tests the VAR UPDATE flag 16 (in step 57), and if that flag associated with one of the input variables 13 of the function module 11 is set, the executive program must process the function module, as depicted in step 60, and the VAR UPDATE flags 16 associated with the output variables 14 are set, and the flags 20 and 21 are conditioned to indicate that the function module was considered. Otherwise, if the VAR NO UPDATE flags 17 associated with all of the function module's input variables 13 are set, the executive program 10 need not process the function module, saving time in the simulation run, but it does set the VAR NO UPDATE flags 17 associated with the output variables 14 and condition the flags 20 and 21 to indicate that the function module was considered.

The invention provides several advantages over prior simulation systems. The flags associated with the input and output variables simplify sequencing of the executive program 10 through the script 12. In particular, the flags permit the executive program to determine (1) when the input variables of a function module are ready so as to permit the function module to be processed, which occurs if all of the input variables' VAR IDLE flags 15 are reset and at least one of their VAR UPDATE flags 16 is set (in which case not all of the function module's input variable's VAR NO UPDATE flags 17 are set), and (2) when a particular function module need not be processed, which occurs if all of the input variables' VAR IDLE flags 15 are reset and all of the function module's input variable's VAR NO UPDATE flags 17 are set (it will be appreciated that, in this case, none of their VAR UPDATE flags 16 will be set).

In addition, the flags associated with the function modules 11 permits the executive program to determine when all of the function modules which require processing have been processed, thus indicating the end of the simulation run in respect of input values provided by an operator.

Finally, since the invention provides that the output values from the function modules 11 may be graphically displayed in windows each associated with the function modules, the operator may view the results of a simulation quickly and easily. This makes the simulation system particularly useful in, for example, signal processing or similar analog system applications, since the operator may view on the display the effect of the simulation on the input values.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A system comprising:
   A. a sequence of function modules each having one or more input variables and one or more output variables, each input variable and each output variable having an associated flag having a plurality of conditions indicating the update status of the associated input or output variable;
   B. an executive program including:
   i. a sequencer for sequencing through said function modules in a sequential order defined by an operator,
   ii. a processor for determining, for each function module in the sequence, consideration status of each of said function modules in response to the conditions of the flags associated with the respective function module's input variables and for processing each of said function modules in response to them having a predetermined consideration status, and
   iii. a flag update element for conditioning, during processing of each function module, the flags associated with the function module's output variables in response to a predetermined module's output variable in response to a predetermined consideration status.

2. A system as defined in claim 1 in which:
   A. each function module further has an associated consideration status flag indicating a predetermined consideration status;
   B. said processor further includes a consideration status flag test element for testing the consideration status flag of each function module and for enabling said sequencing means to sequence to a subsequent function module in said order in response to said consideration flag test element determining that said consideration status flag has predetermiend condition.

3. A system as defined in claim 1 in which said executive program further comprises an initializer for initializing said flags to predetermined conditions.

4. A system as defined in claim 1 in which said executive program further comprises a variable update element for updating said input variables.

5. A method of controlling processing of a plurality of function modules, each having one or more input variables and one or more output variables, each input variable and each output variable having an associated flag having a plurality of conditions indicating the update status of the associated input or output variable, said method comprising the steps of:
   A. sequencing through said function modules in a sequential order defined by an operator,
   B. determining, for each function module during a sequence, the consideration status of each of said function modules in response to the conditions of the flags associated with the respective function module's input variables and processing said modules in response to a predetermined consideration status, and C. conditioning, during processing of each function module, the flags associating with the function module's output variables in response to a predetermined consideration status.

* * * * *